United States Patent
Matsubara et al.

(10) Patent No.: US 7,645,692 B2
(45) Date of Patent: Jan. 12, 2010

(54) SEMICONDUCTOR DEVICE AND METHOD OF MANUFACTURING THE SAME

(75) Inventors: Yoshihisa Matsubara, Kanagawa (JP); Hiroki Shirai, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/945,557

(22) Filed: Nov. 27, 2007

(65) Prior Publication Data
US 2008/0121964 A1    May 29, 2008

(30) Foreign Application Priority Data
Nov. 27, 2006    (JP)    ............................. 2006-318051

(51) Int. Cl.
*H01L 21/3205* (2006.01)
(52) U.S. Cl. .................. 438/587; 438/585; 438/583; 257/338
(58) Field of Classification Search ................. 257/204, 257/296, 298, 341, 369, 377, 382, 384, 388, 257/412–413, 456, 532, 766, E29.156, E23.157, 257/E21.622, E21.636, 338, E21.632, E21.598; 438/210, 241, 587, 630, 649, 651, 655, 664, 438/682, 683, 685, FOR. 360, 585, 583
See application file for complete search history.

(56) References Cited

U.S. PATENT DOCUMENTS

| | | | |
|---|---|---|---|
| 7,166,893 B2 * | 1/2007 | Taniguchi et al. ............ 257/336 |
| 7,432,553 B2 * | 10/2008 | Chen et al. ................... 257/351 |
| 2003/0077859 A1 * | 4/2003 | Jeong ........................... 438/241 |
| 2003/0219953 A1 * | 11/2003 | Mayuzumi ................... 438/353 |
| 2005/0009258 A1 * | 1/2005 | Inoue et al. .................. 438/200 |
| 2005/0167750 A1 * | 8/2005 | Yang et al. .................... 257/347 |
| 2005/0269635 A1 * | 12/2005 | Bojarczuk et al. ........... 257/338 |
| 2006/0237726 A1 * | 10/2006 | Iwamatsu et al. .............. 257/72 |
| 2006/0263961 A1 * | 11/2006 | Kittl et al. .................... 438/199 |
| 2007/0032010 A1 * | 2/2007 | Biery et al. .................. 438/230 |
| 2007/0072371 A1 * | 3/2007 | Tsuzumitani ................ 438/257 |
| 2007/0122966 A1 * | 5/2007 | Hoentschel et al. .......... 438/231 |

FOREIGN PATENT DOCUMENTS

| | | | |
|---|---|---|---|
| JP | 2001-127270 A | 5/2001 |
| JP | 03/096421 A1 | 11/2003 |
| JP | 2005-191428 A | 7/2005 |

* cited by examiner

*Primary Examiner*—Theresa T Doan
(74) *Attorney, Agent, or Firm*—Young & Thompson

(57) ABSTRACT

In one embodiment of the present invention, provided is a semiconductor device having a silicon substrate provided with a DRAM region containing first transistors and capacitor elements, and with a logic region containing second transistors. A minimum gate length of the second transistors provided in the logic region is smaller than a minimum gate length of the first transistors provided in the DRAM region. One of a cobalt silicide layer and a titanium silicide layer is provided on source/drain regions and on gate electrodes of the first transistors provided in the DRAM region, and a nickel-containing silicide layer is provided on source/drain regions and on gate electrodes of the second transistors provided in the logic region.

5 Claims, 8 Drawing Sheets

790°C

500°C 30sec

SEMICONDUCTOR DEVICE AND METHOD OF MANUFACTURING THE SAME

This application is based on Japanese patent application No. 2006-318051 the content of which is incorporated hereinto by reference.

BACKGROUND

1. Technical Field

The present invention relates to a semiconductor device and a method of manufacturing the same, and in particular to a semiconductor device having silicide layers, and a method of manufacturing the same.

2. Related Art

There is known a conventional semiconductor device such as described in Japanese Laid-Open Patent Publication No. 2001-127270, describing formation of a semiconductor device of the embedded DRAM (dynamic random access memory), in which a silicide layer is formed over the entire surfaces of the DRAM section and the logic section, at a time in a single process step.

Nickel silicide has been becoming more popular as the silicide generally used for CMOS (complementary metal oxide semiconductor) device, rather than cobalt silicide and titanium silicide, as the elements are shrunk to a higher degree. This is because nickel silicide is superior to cobalt silicide, from the viewpoint of so-called thin wire effect, characterized by increase in sheet resistance under smaller gate length.

Adoption of nickel silicide is, however, more likely to cause junction leak as compared with cobalt silicide or the like. More specifically, nickel has the melting temperature lower than those of titanium and cobalt, and is therefore more reactive with the silicon composing the silicon substrate. Nickel atoms in the nickel silicide layer are more likely to diffuse across p-n junctions at the source/drain interfaces into the silicon substrate during annealing involved in the process of manufacturing. For this reason, adoption of nickel silicide with transistors provided in regions such as those in a DRAM section, under severe requirements in terms of suppression of junction leakage current, has been anticipated to cause current leakages possibly exceeding an allowable limit. It has therefore been difficult to adopt nickel silicide to the embedded DRAM device having transistors with a short gate length.

One known technique of improving this non-conformity is described in a pamphlet of International Patent WO 2003/96421. The literature describes a technique of forming a nickel silicide layer in transistors in the logic section, but providing no silicide layer to the transistors in the DRAM cell section. Providing no silicide layer to the transistors in the memory section, while providing silicide layer to the transistor in the peripheral circuit, is described also in Japanese Laid-Open Patent Publication No. 2005-191428.

SUMMARY OF THE INVENTION

However, the configurations described in the pamphlet of International Patent WO 2003/96421 and Japanese Laid-Open Patent Publication No. 2005-191428 cannot reduce resistance of the source/drain regions, because the transistors provided to the DRAM cell section have no silicide layer formed therein. Therefore, there has been some room for improvement in operation speed of the device as a whole.

The present inventors made thorough investigations aiming at improving a balance between characteristics of semiconductor devices having silicide layers and production yield, and completed the present invention.

According to the present invention, there is provided a semiconductor device having a silicon substrate provided with a first region containing first transistors and capacitor elements, and with a second region containing second transistors, wherein a minimum gate length of said second transistors is smaller than a minimum gate length of said first transistors, and one of a cobalt silicide layer and a titanium silicide layer is provided on source/drain regions and on gate electrodes of said first transistors, and a nickel-containing silicide layer is provided on source/drain regions and on gate electrodes of said second transistors.

According to the present invention, there is provided also a method of manufacturing a semiconductor device containing a first region provided with capacitor elements and first transistors, and a second region provided with second transistors, comprising: forming first gate electrodes of said first transistors on a silicon substrate in said first region, and forming on second gate electrodes, of said second transistors on said silicon substrate in said second region, said second gate electrode having a minimum gate length smaller than a minimum gate length of said first gate electrodes; forming first source/drain regions in said silicon substrate beside said first gate electrodes, and forming second source/drain regions in said silicon substrate beside said second gate electrodes; forming, after said forming the first gate electrodes and the second gate electrodes, a first insulating film on said silicon substrate as being extended from said first region to said second region; forming, after selectively removing said first insulating film in said first region, one of a cobalt film and a titanium film on an element-forming surface of said silicon substrate, and annealing them at a first temperature, to thereby form a first silicide layer on said first source/drain regions and on said first gate electrodes; forming, after said forming the first silicide layer, a second insulating film over said silicon substrate, as being extended from said first region to said second region; and selectively removing said first and second insulating films in said second region, forming a nickel-containing film on said element-forming surface, and annealing them at a second temperature, to thereby form a second silicide layer on said second source/drain regions and on said second gate electrodes.

In the present invention, a plurality of element regions differing in characteristics are provided to the silicon substrate. Of these, the first region is provided with the first transistors and capacitor elements, and second region is provided with the second transistors having a minimum gate length smaller than a minimum gate length of the first transistors.

In the present invention, different types of silicide layers are used on the source/drain regions and the gate electrodes of the transistors based on an independent choice, depending on characteristics of these regions.

More specifically, as for the first region containing capacitor elements, strictly required to be suppressed in junction leakage current, use of cobalt silicide or titanium silicide may successfully form a stable junction less causative of leakage, and may thereby improve reliability and production yield of elements provided to the first region. This is supposedly because cobalt and titanium react with silicon at higher temperatures, and thus the resultant silicides are more thermally stable and are therefore less likely to cause migration of metals at the junction interface of the source/drain regions in the silicon substrate.

As for the second region provided with the second transistors having smaller minimum gate length, use of nickel containing silicide causative of the thin wire effect only at smaller sizes, may successfully improve the production yield of the second transistors, and may thereby increase operation speed of the second transistors.

By virtue of the above-described configuration, the production yield of elements may be improved, and excellence in the reliability may be ensured, both for the first region and the second region, and thereby a balance between enhancement in performances of the semiconductor device as a whole and production yield may be improved.

In the present invention, the first region may be configured as containing DRAM cells, for example.

In the present invention, the second region may be configured as containing a logic region, for example.

It is to be understood herein that, in this patent specification, the logic region represents a wide concept covering configurations having various circuits provided therein, and typically includes also a region having peripheral circuits of the memory elements, such as a sense amplifier circuit, an addressing circuit, and so forth. For example, in the semiconductor device of the present invention, the logic region may contain the peripheral circuits of the memory region.

As has been described in the above, the present invention may successfully improve the balance between the characteristics and production yield of the semiconductor device having the silicide layers, by using silicide layers based on an independent choice, depending on characteristics of a plurality of element regions provided to the silicon substrate.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
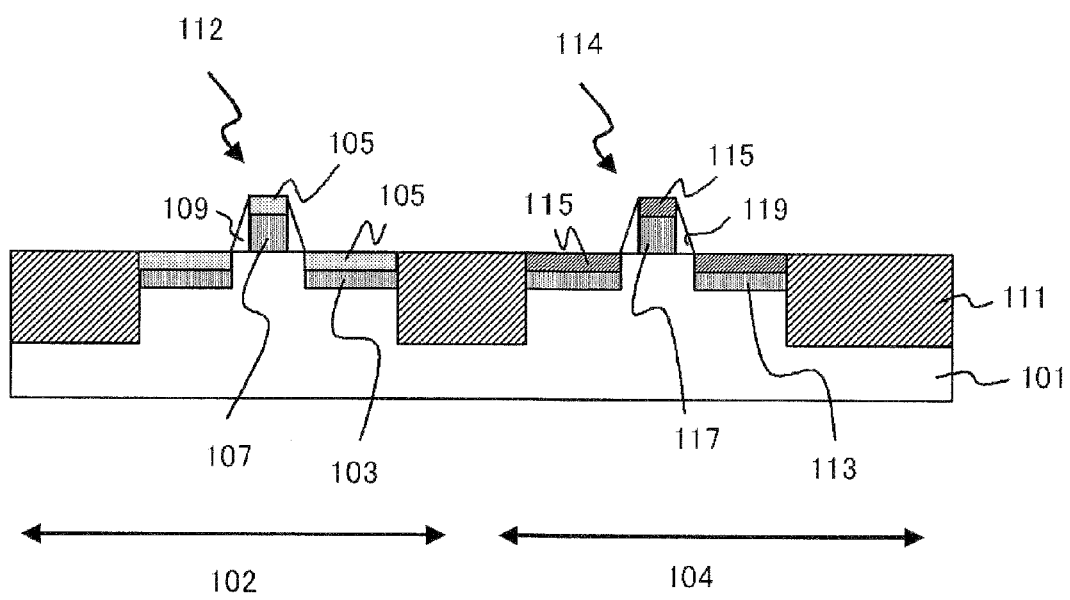
FIGS. 1 and 2 are sectional views showing configurations of a semiconductor device according to one embodiment.

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

Paragraphs below will describe embodiments of the present invention, while exemplifying a semiconductor device having DRAM cells and a logic circuit formed on a same substrate, that is, an embedded DRAM, referring to the attached drawings. It is to be understood that, in all drawings, any similar constituents commonly appear will be given with the same reference numerals, and explanations therefor will not be repeated.

First Embodiment

FIG. 1 is a sectional view showing configuration of a semiconductor device according to this embodiment.

In the semiconductor device 100 shown in FIG. 1, a silicon substrate 101 is provided with a first region (DRAM region 104) containing capacitor elements (DRAM memory element, not shown), and a second region (logic Nch region 102). The logic Nch region 102 and the DRAM region 104 are provided with a second transistor 112 and a first transistor 114, respectively. A minimum gate length of the transistor provided to the logic Nch region 102 is smaller than a minimum gate length of the transistor provided to the DRAM region 104.

This embodiment will now be explained referring to an exemplary case where the logic region (logic Nch region 102) is provided with N-channel transistors, wherein the channel type of the transistors provided to the logic region in this embodiment and embodiments thereafter may be N-type or may be P-type. It is also allowable to provide CMOS transistors to the logic region.

A cobalt silicide layer or a titanium silicide layer is provided on source/drain regions (first source/drain regions 113) and on a gate electrode (first gate electrode 117) of the first transistor 114, and a nickel silicide layer 105 is provided on source/drain regions (second source/drain regions 103) and on a gate electrode (second gate electrode 107) of the second transistor 112.

The first transistor 114 is configured as containing the first source/drain regions 113, cobalt silicide layers 115, the first gate electrode 117, first sidewall insulating films 119 and a first gate insulating film (not shown).

The second transistor 112 is configured as containing the second source/drain regions 103, nickel silicide layers 105, the second gate electrode 107, second sidewall insulating films 109 and a second gate insulating film (not shown).

The first transistor 114 and the second transistor 112 are isolated by an element isolation region 111 embedded in the silicon substrate 101. The element isolation region 111 is configured typically as STI (shallow trench isolation).

A method of manufacturing the semiconductor device 100 will be explained below. The method of manufacturing includes the following steps.

step 11: forming the first gate electrode 117 of the first transistor 114 on the silicon substrate 101 in the DRAM region 104, and forming the second gate electrode 107, having a minimum gate length smaller than a minimum gate length of the first gate electrode 117, of the second transistor 112 on the silicon substrate 101 in the logic Nch region 102;

step 12: forming the first source/drain regions 113 in the silicon substrate 101 beside the first gate electrode 117, and forming the second source/drain regions 103 in the silicon substrate 101 beside the second gate electrode 107;

step 13: forming, after forming the first gate electrode 117 and the second gate electrode 107, a first insulating film (SiO$_2$ film 121) on the silicon substrate 101 as being extended from the region for forming the first transistor 114 to the region for forming the second transistor 112;

step 14: forming, after selectively removing the SiO$_2$ film formed in the region for forming the first transistor 114, a cobalt film or a titanium film (cobalt film 126) on the element-forming surface of the silicon substrate 101, and annealing them at a first temperature, to thereby form a first silicide layer (cobalt silicide layer 115) on the first source/drain regions 113 and on the first gate electrode 117;

step 15: forming, after step 14 forming the cobalt silicide layer 115, a second insulating film (first directly-nitrided film 125) over the silicon substrate 101, as being extended from the region for forming the first transistor 114 to the region for forming the second transistor 112; and step 16: forming, after selectively removing the SiO$_2$ film 121 and the first directly-nitrided film 125 formed in the region for forming the second transistor 112, a nickel-containing film (nickel film 129) on the element-forming surface, and annealing them at a second temperature, to thereby form a second silicide layer (nickel silicide layer 105) on the second source/drain regions 103 and on the second gate electrode 107. In the specification of the present invention, the element-forming surface means a surface of the silicon substrate on which elements, such as transistors, are formed.

The process will further specifically be explained below, referring to FIGS. 3A to 7B.

FIGS. 3A to 7B are sectional views showing process steps of manufacturing the semiconductor device according to this embodiment and a second embodiment.

Figure 3A:
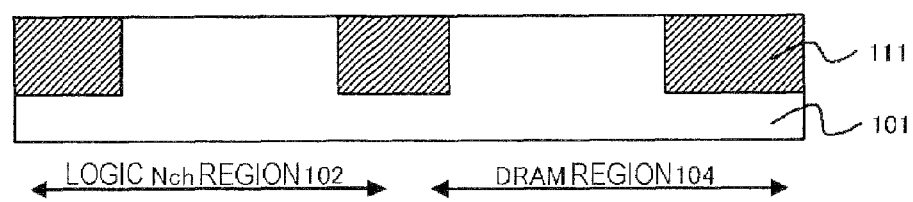
FIGS. 3A to 7B are sectional views showing process steps of manufacturing the semiconductor device according to embodiments.
Figure 3B:
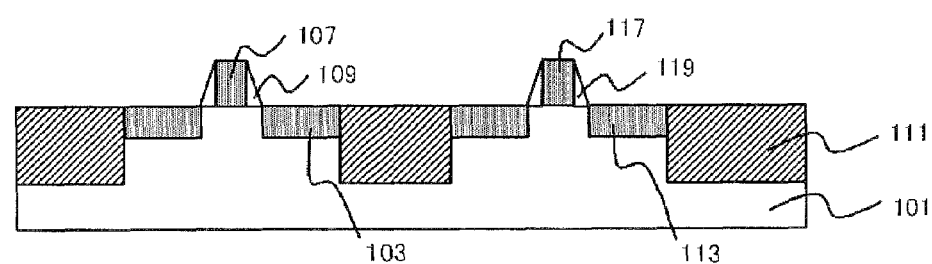
Figure 3C:
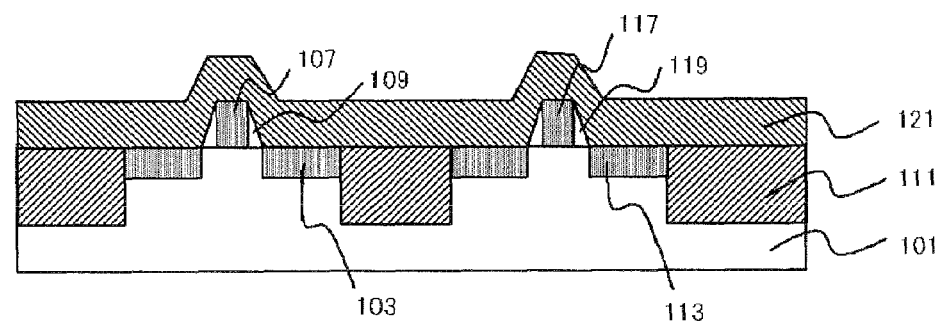

First, as shown in FIG. 3A, element isolation regions 111 having a form of STI are formed at predetermined positions in the P-type silicon substrate 101.

Next, the first gate electrode 117 is formed at a predetermined position in the DRAM region 104, and the second gate electrode 107 is formed at a predetermined position in the logic Nch region 102 (step 11). A material composing these gate electrodes may typically be a material containing silicon as a constitutive element, such as polysilicon. The second sidewall insulating films 109 and the first sidewall insulating films 119 are then formed so as to cover the side faces of the second gate electrode 107 and the first gate electrode 117. A material for composing the second sidewall insulating films 109 and first sidewall insulating films 119 may be $SiO_2$.

Next, an N-type impurity is introduced by ion implantation into the silicon substrate 101 beside the first gate electrode 117, to thereby form the first source/drain regions 113. An N-type impurity is introduced by ion implantation also into the silicon substrate 101 beside the second gate electrode 107, to thereby form the second source/drain regions 103 (step 12, FIG. 3B). These steps may be carried out independently, or at the same time.

Figure 4A:
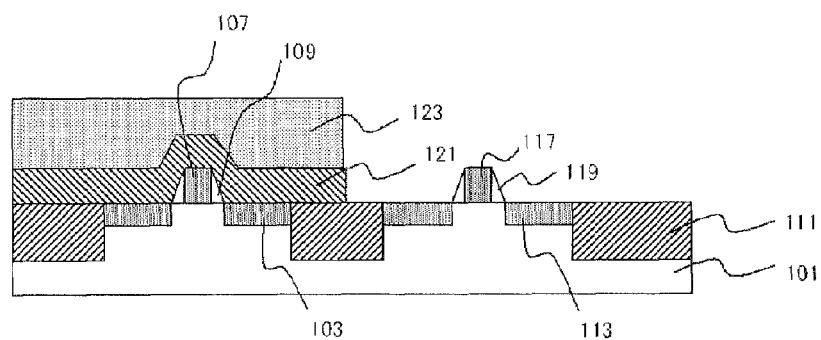
Figure 4B:
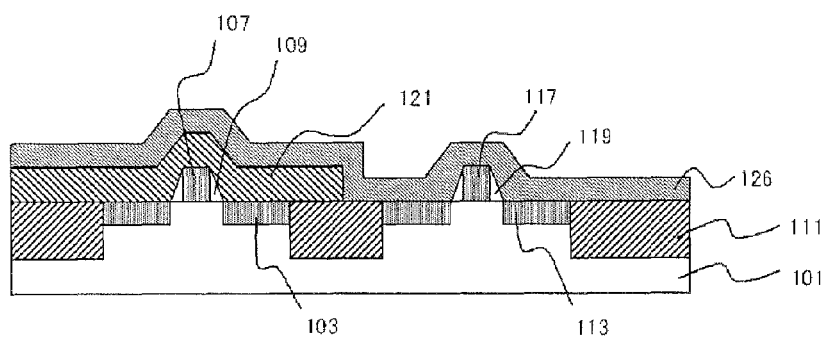

The $SiO_2$ film 121 is then formed so as to cover the entire surface of the element-forming surface of the silicon substrate 101 (step 13, FIG. 3C), a mask 123 having an opening in the region for forming the first transistor 114 is formed on the $SiO_2$ film 121, and a portion of the $SiO_2$ film 121 fallen in the region for forming the first transistor 114 is selectively removed, so as to expose the surfaces of the first source/drain regions 113 and the first gate electrode 117 (FIG. 4A).

Figure 4C:
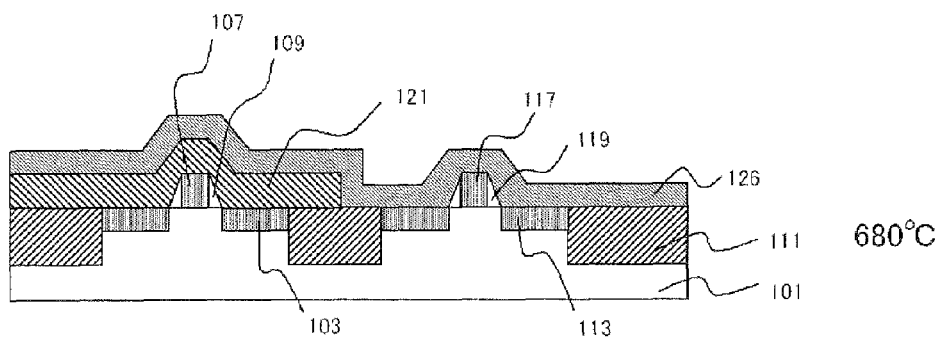
Figure 5A:
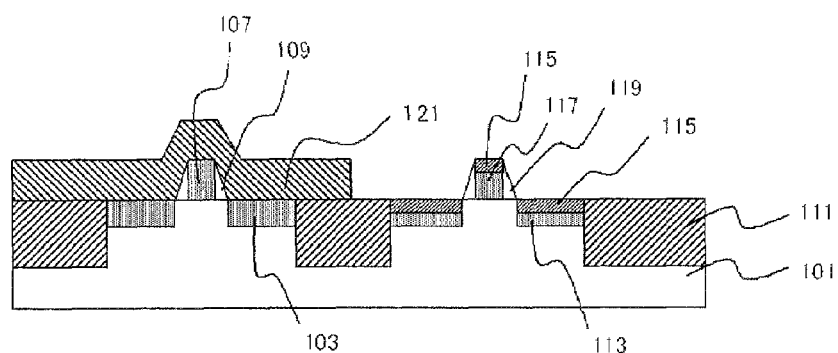
Figure 5B:
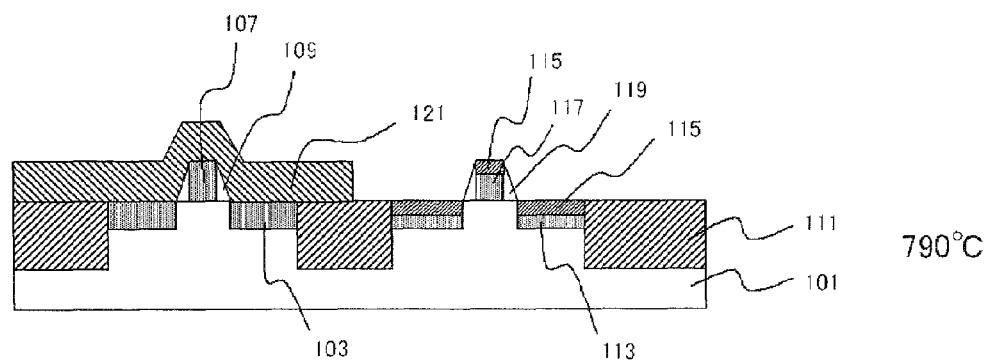
Figure 5C:
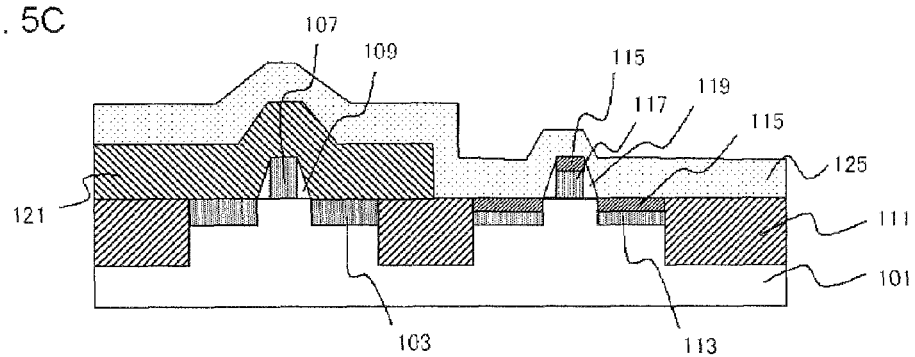

After the mask 123 is removed, cobalt is sputtered over the entire surface of the element forming region of the silicon substrate 101, to thereby form a cobalt film 126 (FIG. 4B), and the substrate 101 is then subjected to first sintering typically at 680° C. (FIG. 4C). Unreacted portion of the cobalt film 126 is removed (FIG. 5A), and the silicon substrate 101 is then subjected to a second sintering typically at 790° C. By this process, the cobalt silicide layer 115 is formed in the upper portions of the first source/drain regions 113 and of the first gate electrode 117 (step 14, FIG. 5B).

Figure 6A:
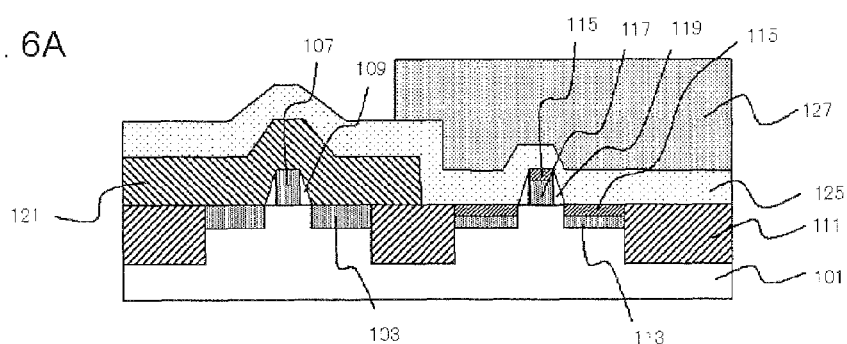
Figure 6B:
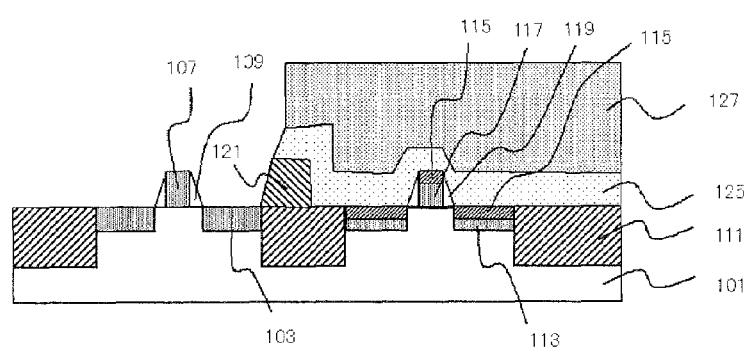

Thereafter, the first directly-nitrided film 125 is formed over the entire surface of the element forming surface of the silicon substrate 101 (step 15, FIG. 5C), and a mask 127 having an opening in the region for forming the second transistor 112 is formed on the first directly-nitrided film 125 (FIG. 6A). Portions of the first directly-nitrided film 125 and the $SiO_2$ film 121 fallen in the region for forming the second transistor 112 are selectively removed in a sequential manner, so as to expose the surfaces of the second source/drain region 103 and second gate electrode 107 (FIG. 6B).

Figure 6C:
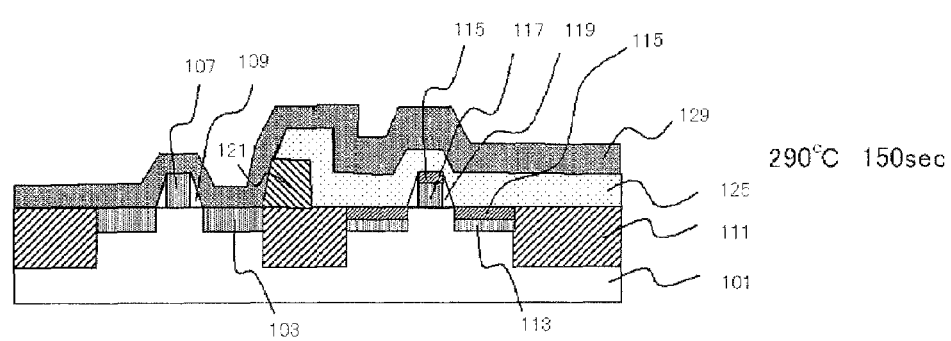

After the mask 127 is removed, the nickel film 129 is formed over the entire surface of the element forming surface of the silicon substrate 101, and the silicon substrate 101 is subjected to first sintering typically under conditions of 290° C. for 150 seconds (FIG. 6C). Unreacted portion of the nickel film 129 is removed (FIG. 7A), and the silicon substrate 101 is then subjected to second sintering under conditions of 500° C. for 30 seconds, for example. By this process, a nickel silicide (NiSi) layer 105 is formed in the upper portions of the second source/drain regions 103 and of the second gate electrode 107 (step 16, FIG. 7B). In this embodiment, the nickel film 129 is exemplified. However a nickel-containing film is also available. For example, a film which contains nickel and platinum is preferably used for higher thermal stability.

Figure 7A:
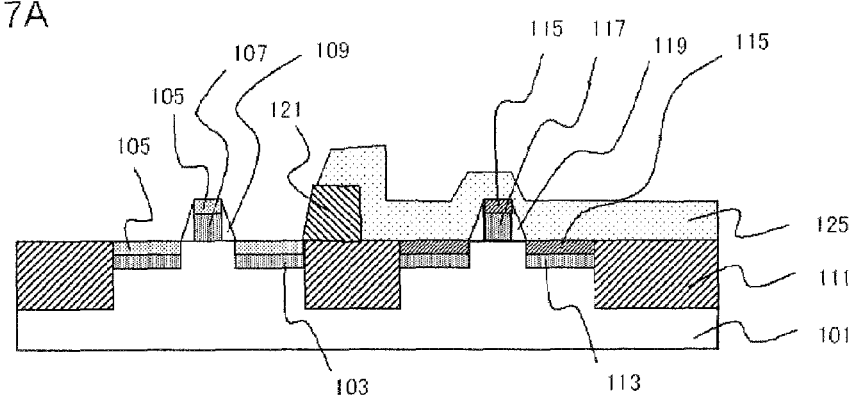
Figure 7B:
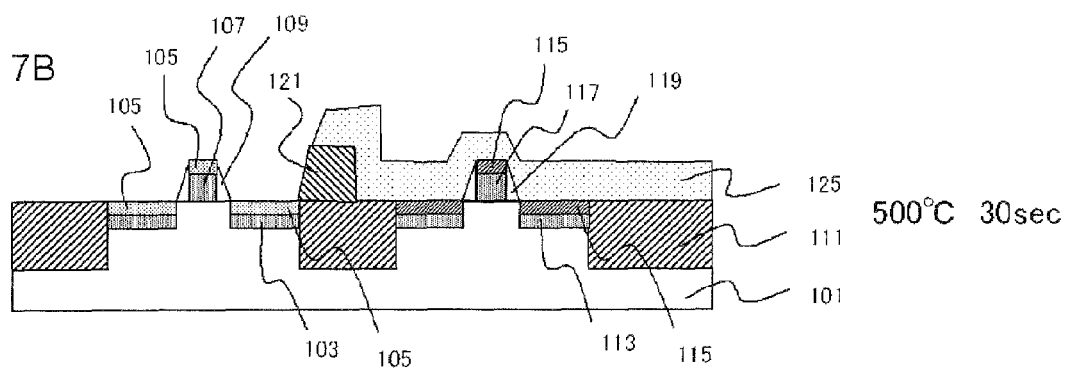

By these procedures, the semiconductor device 100 shown in FIG. 1 may be obtained. FIG. 7B shows that the first directly-nitrided film 125 and so forth formed on the first transistor 114 are left unremoved, wherein the films may be remained as a directly-nitrided film, without being removed in the later processes, as described later in a second embodiment.

In this embodiment, the silicide layers respectively adopted to the regional characteristics of the logic Nch region 102 and the DRAM region 104 are used based on an independent choice. Operations and effects described below may be obtained as a consequence.

The logic region containing the logic Nch region 102 has a relatively small gate length in view of improving the operation speed. Ni silicide is therefore formed on the gate electrodes and on the source/drain regions, for the purpose of improving the production yield while suppressing the thin wire effect. By this configuration, the operation speed and production yield of the transistors in the logic region may be improved. An allowable level of leakage current of the transistors provided to the logic region may be adjustable to a non-problematic level on the practical basis, even if the nickel silicide layer 105 is formed.

On the other hand, the gate length is not a key factor of governing the operation speed of DRAM provided to the DRAM region 104. The minimum gate length of the transistors provided to the DRAM region 104 is set larger than the minimum gate length of the transistors provided to the logic Nch region 102. The DRAM region 104 is controlled under an allowable level of junction leakage more strictly than in the logic Nch region 102. Provision of the cobalt silicide layer 115 less causative of junction leakage to the first transistor 114 may, therefore, improve reliability of the element.

As has been described in the above, this embodiment may improve the balance between the operation speed or reliability of the device as a whole, and the production yield, by adopting different types of silicide layers to the logic Nch region 102 and the DRAM region 104, as being adapted to the characteristics of these regions, even at some sacrifices of making the manufacturing processes more complicated, and making the chip area more larger. This embodiment, based on adjustment of the gate length of the first transistor 114 to 60 nm or larger, may also suppress expression of the thin wire effect in the first transistor 114 in a more reliable manner, and may further improve the production yield of devices. This effect is distinctively expressed particularly when the gate length of the first transistor 114 is 90 nm or larger. While there is no special limitation on the upper limit of the gate length of the first transistor 114, it is preferably adjusted to 1 μm or smaller.

Although the chip area of the semiconductor device may become larger by making the gate length of the transistors in the DRAM region 104 larger than the gate length of the transistors in the logic region, memory capacitance (number of bits) of DRAM provided on embedded DRAM is not so large as that of general DRAM, causing only a non-problematic level of influences on the chip size on the practical basis.

In this embodiment, the sintering temperature of the nickel silicide layer 105 formed later is lower than the sintering temperature of the cobalt silicide layer 115 formed earlier. By virtue of this strategy, the cobalt silicide layer 115 and other elements formed earlier may be prevented from denaturing or degrading due to annealing in the process of forming the nickel silicide layer 105.

The following embodiment will be explained, placing a focus on aspects different from those in the first embodiment.

Second Embodiment

The configuration of the insulating films on the upper portions of the source/drain regions and the gate electrodes of the individual transistors in the semiconductor device 100 (first embodiment) shown in FIG. 1 may be modified as described below.

Figure 2:
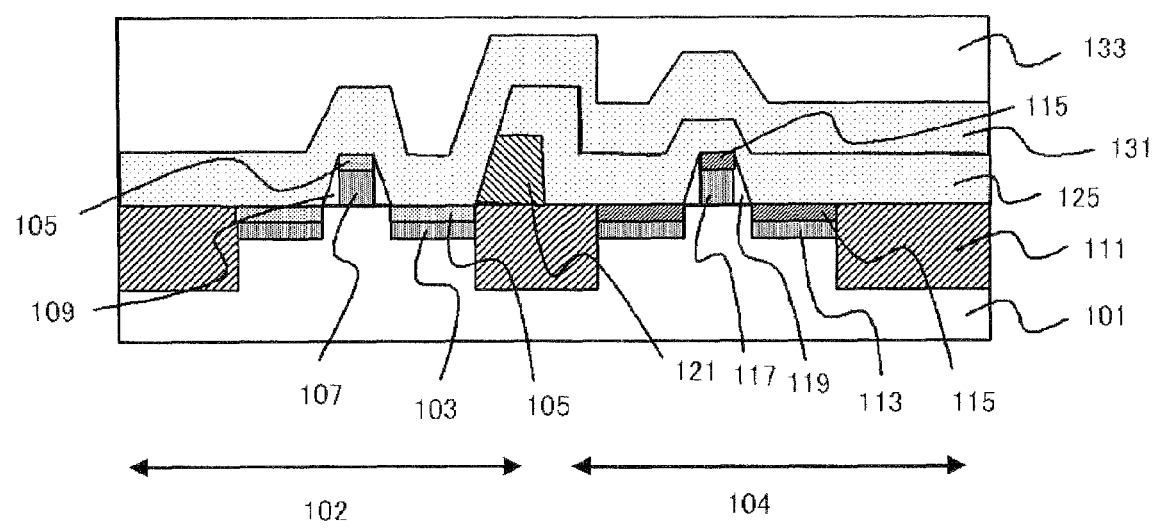

FIG. 2 is a sectional view showing a configuration of the semiconductor device according to this embodiment.

The basic configuration of the semiconductor device 110 shown in FIG. 2 is same as that of semiconductor device 100 shown in FIG. 1. In the semiconductor device 110, the first directly-nitrided film 125 and a second directly-nitrided film 131 cover the upper portions of the first source/drain regions 113 and the first gate electrode 117 of the first transistor 114.

The first directly-nitrided film 125 is provided in contact with the cobalt silicide layer 115. The first directly-nitrided film 125 is provided selectively to the DRAM region 104, but not provided to the logic Nch region 102.

The second directly-nitrided film 131 is provided in contact with the upper surface of the first directly-nitrided film 125. The second directly-nitrided film 131 is also provided as being extended from the logic Nch region 102 to the DRAM region 104, and covers the upper portions of the second source/drain regions 103 and the second gate electrode 107 in the logic Nch region 102. The second directly-nitrided film 131 is provided in contact with the nickel silicide layer 105.

In the logic Nch region 102 and the DRAM region 104, an insulating interlayer 133 is provided to the upper portion of the second directly-nitrided film 131.

The semiconductor device 110 may be obtained, after obtaining the structure shown in FIG. 7B using the procedures described referring to FIG. 3A to FIG. 7B, by forming a third insulating film (second directly-nitrided film 131) as being extended over the region for forming the first transistor 114 to the region for forming the second transistor 112, and then by forming the insulating interlayer 133 on the second directly-nitrided film 131.

According to this embodiment, operations and effects in addition to those in the first embodiment may be obtained.

In this embodiment, the films covering the first source/drain regions 113 and the first gate electrode 117 of the first transistor 114 are insulating films having tensile stress (first directly-nitrided film 125 and second directly-nitrided film 131) provided on the silicon substrate 101. More specifically, the first directly-nitrided film 125 and the second directly-nitrided film 131 are SiN films. Provision of the directly-nitrided films may produce tensile stress in the direction of gate length of the first transistor 114, and may further improve the ON current of the first transistor 114 given as an N-MOS transistor.

For the case where CMOS transistors are provided in the logic region containing the logic Nch region 102, provision of the directly-nitrided films on the source/drain regions and the gate electrode of the CMOS transistors may increase ON current of the N-type MOS transistor. On the other hand, as for P-type MOS transistors composing the CMOS transistors, too large thickness of the directly-nitrided film may result in decrease in the ON current.

As for the DRAM region 104, the first transistor 114 connected to the capacitor element is of N-type, so that thickening of the directly-nitrided film may further increase the ON current.

Therefore in this embodiment, the operation speed of the device as a whole may further be improved, by using different types of silicide layers based on an independent choice, as being adapted to the characteristics of the element regions provided to the silicon substrate 101, and further by adjusting the thickness of the directly-nitrided film.

More specifically, the directly-nitrided film composed of the first directly-nitrided film 125 and the second directly-nitrided film 131 is provided as being extended from the DRAM region 104 to the logic Nch region 102, and covers, on the silicon substrate 101, the first source/drain regions 113 and the first gate electrode 117 of the first transistor 114, and the second source/drain regions 103 and the second gate electrode 107 of the second transistor 112. The thickness of the directly-nitrided film in the DRAM region 104 is set larger than the thickness of the directly-nitrided film in the logic Nch region 102.

The films formed on the second transistor 112 and the first transistor 114 are not limited to SiN films, provided that they are insulating films causative of tensile stress.

The embodiments of the present invention having been described in the above referring to the drawings are merely for exemplary purpose of the present invention, allowing adoption of any arbitrary combinations of these configurations or various configurations other than those described in the above.

For example, the silicide layer in the DRAM region 104, exemplified by the cobalt silicide layer 115 in the above-described embodiments, may be replaced by a titanium silicide layer. Furthermore the silicide layer in the login Nch region 102, exemplified by the nickel silicide layer 105 in the above-described embodiments, may be replaced by a nickel-containing silicide layer. For example, a silicide layer which contains nickel and platinum may be used.

EXAMPLE

Example

In this Example, the DRAM-logic-embedded device (first embodiment) described referring to FIG. 1 was manufactured, and the operation speed of device was evaluated.

The gate length of the N-type MOS transistors of the DRAM region was set to 0.12 μm, and the gate width to 0.2 μm. The gate length of the N-type MOS transistors in the logic region was set to 0.06 μm, and the gate width to 0.2 μm. Polysilicon was selected as a material for composing the gate electrodes both in the memory region and the logic region.

The silicide layer in the memory region was a cobalt silicide layer, and the silicide layer in the logic region was a nickel silicide layer.

Comparative Example 1

The gate length of the N-type MOS transistors in the logic region in Example 1 was modified to 0.12 μm, and the gate width to 0.2 μm. Cobalt silicide was used also for the silicide layer in the logic region. Except for these modifications, the semiconductor device was manufactured and evaluated similarly to as described in Example.

Comparative Example 2

The gate length of the N-type MOS transistors in the logic region in Example 1 was modified to 0.06 μm, and the gate width to 0.2 μm. Cobalt silicide was used also for the silicide layer in the logic region. Except for these modifications, the semiconductor device was manufactured and evaluated similarly to as described in Example.

Comparative Example 3

In Example, nickel silicide was used also for the silicide layer in the memory region. Except for the modification, the semiconductor device was manufactured and evaluated similarly to as described in Example.

Evaluation

ON current (Ion) of the transistors provided to the DRAM region and logic region was measured as an index expressing device speed (function speed) of the semiconductor devices obtained in Example and the individual Comparative Examples. Results are shown in FIG. 8.

Figure 8:
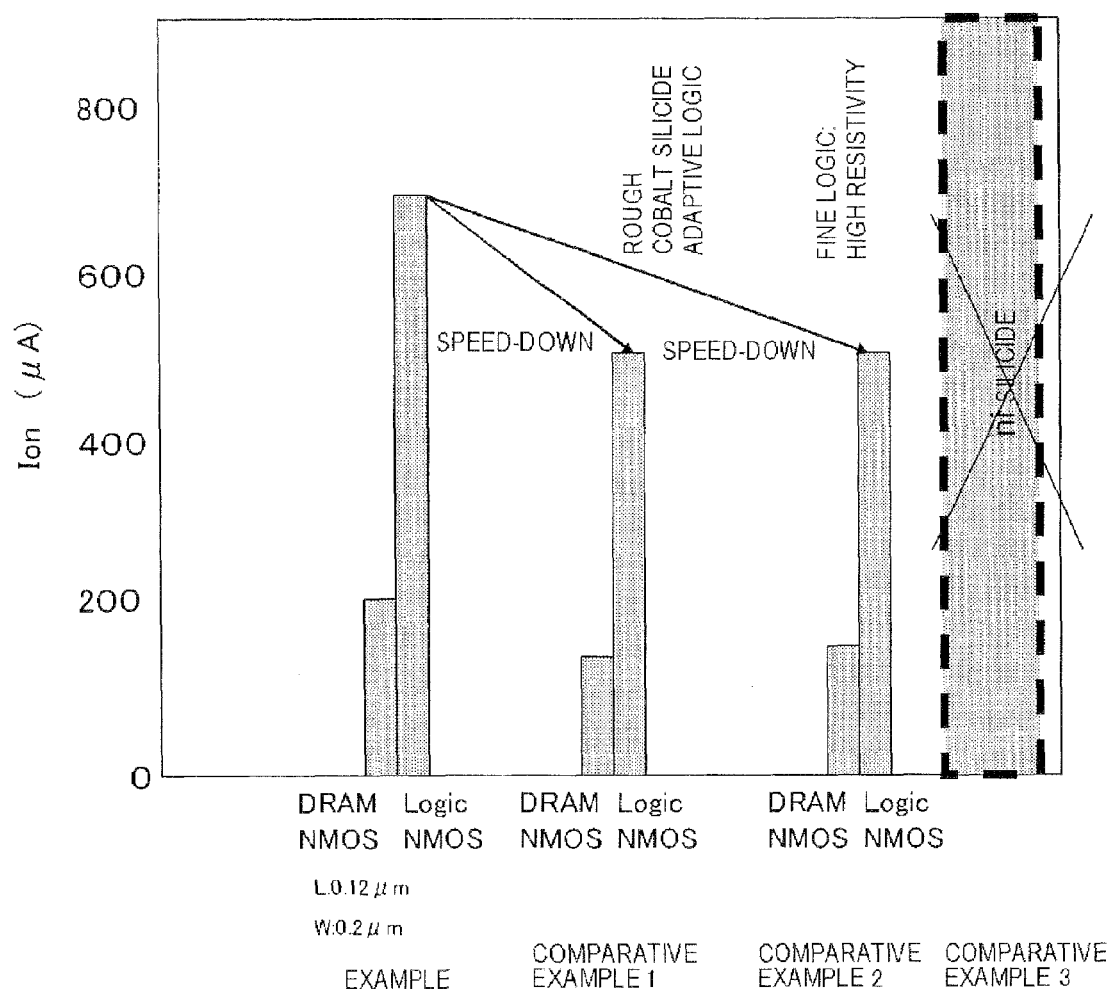
FIG. 8 is a drawing showing results of evaluation of ON current of the semiconductor device according to Example.

It was confirmed from FIG. 8 that the semiconductor device of Example was improved in the ON current both for the transistors in the memory region and for the transistors in the logic region, as compared with the semiconductor devices of Comparative Example 1 and Comparative Example 2.

Comparative Example 1 showed an operation speed only slower than in Example, supposedly because the gate electrodes of the transistors provided to the logic region were not fully downsized, and Comparative Example 2 showed an elevated resistance, supposedly because cobalt silicide was adopted to the configuration downsized similarly to as fine as in Example.

The semiconductor device of Comparative Example 3 failed in obtaining stable results of evaluation, because the junction leakage current could not satisfy a required level.

It is apparent that the present invention is not limited to the above embodiment, that may be modified and changed without departing from the scope and spirit of the invention.

What is claimed is:

1. A method of manufacturing a semiconductor device containing a first region provided with capacitor elements and first transistors, and a second region provided with second transistors, comprising:
   forming first gate electrodes of said first transistors on a silicon substrate in said first region, and forming second gate electrodes of said second transistors on said silicon substrate in said second region, said second gate electrode having a minimum gate length smaller than a minimum gate length of said first gate electrodes;
   forming first source/drain regions in said silicon substrate beside said first gate electrodes, and forming second source/drain regions in said silicon substrate beside said second gate electrodes;
   forming, after said forming the first gate electrodes and the second gate electrodes, a first insulating film on said silicon substrate as being extended from said first region to said second region;
   forming, after selectively removing said first insulating film in said first region, one of a cobalt film and a titanium film on an element-forming surface of said silicon substrate, and annealing the element-forming surface and the one of a cobalt film and a titanium film at a first temperature, to thereby form a first silicide layer on said first source/drain regions and on said first gate electrodes;
   forming, after said forming the first silicide layer, a second insulating film over said silicon substrate, as being extended from said first region to said second region; and
   selectively removing said first and second insulating films in said second region, forming a nickel-containing film on said element-forming surface, and annealing the nickel-containing film and said element-forming surface at a second temperature, to thereby form a second silicide layer on said second source/drain regions and on said second gate electrodes.

2. The method of manufacturing a semiconductor device as claimed in claim 1,
   wherein said second temperature is lower than said first temperature.

3. The method of manufacturing a semiconductor device as claimed in claim 1,
   wherein said first insulating film is a film causative of tensile stress.

4. The method of manufacturing a semiconductor device as claimed in claim 1,
   wherein said first insulating film is a silicon oxide film, and said second insulating film is a silicon nitride film.

5. The method of manufacturing a semiconductor device as claimed in claim 4, further comprising:
   succeeding to said forming said second silicide layer, forming a third insulating film as being extended from the first region to the second region, said third insulating film being a silicon nitride film.

* * * * *